United States Patent
Greenwood et al.

(10) Patent No.: US 9,600,618 B2
(45) Date of Patent: *Mar. 21, 2017

(54) IMPLEMENTING SYSTEM IRRITATOR ACCELERATOR FPGA UNIT (AFU) RESIDING BEHIND A COHERENT ATTACHED PROCESSORS INTERFACE (CAPI) UNIT

(71) Applicant: International Business Machines Corporation, Armonk, NY (US)

(72) Inventors: Jason D. Greenwood, Rochester, MN (US); Steven D. McJunkin, Rochester, MN (US); Paul E. Schardt, Rochester, MN (US); Nathaniel K. Tuen, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 17 days.

This patent is subject to a terminal disclaimer.

(21) Appl. No.: 14/696,787

(22) Filed: Apr. 27, 2015

(65) Prior Publication Data

US 2016/0188780 A1 Jun. 30, 2016

Related U.S. Application Data

(63) Continuation of application No. 14/585,602, filed on Dec. 30, 2014.

(51) Int. Cl.
*G06F 17/50* (2006.01)
*G01R 31/3185* (2006.01)

(52) U.S. Cl.
CPC . *G06F 17/5054* (2013.01); *G01R 31/318519* (2013.01)

(58) Field of Classification Search
CPC ............... G06F 17/5054; G06F 2212/621
USPC ............................................. 716/111
See application file for complete search history.

(56) References Cited

U.S. PATENT DOCUMENTS

| | | |
|---|---|---|
| 6,567,934 B1 | 5/2003 | Yen et al. |
| 6,980,975 B2 | 12/2005 | Reed et al. |
| 7,188,041 B1 | 3/2007 | Secatch |
| 8,479,173 B2 | 7/2013 | Hickerson et al. |
| 8,589,892 B2 | 11/2013 | Fournier et al. |
| 2013/0016965 A1 | 1/2013 | Christensen |
| 2014/0107996 A1 | 4/2014 | Cummings et al. |

(Continued)

OTHER PUBLICATIONS

J. M. Ludden et al., "Advances in simultaneous multithreading testcase generation methods," Presentation, 6th International Haifa Verification Conference, HVC 2010, Haifa, Israel, Oct. 4-7, 2010, 21 pages.

(Continued)

*Primary Examiner* — Suchin Parihar
(74) *Attorney, Agent, or Firm* — Joan Pennington

(57) ABSTRACT

A method and apparatus are provided for implementing system irritator accelerator field programmable gate array (FPGA) Units (AFUs) residing behind a Coherent Attached Processors Interface (CAPI) unit in a computer system. An AFU is implemented in an FPGA residing behind the CAPI unit, the AFU includes a system irritator accelerator. A processor configures the AFU and enables the AFU system irritator to execute. The AFU system irritator is replicated to create additional irritation and is re-programmable.

9 Claims, 5 Drawing Sheets

(56) References Cited

U.S. PATENT DOCUMENTS

2014/0149683 A1* 5/2014 Blaner et al. ................ 711/141
2014/0201467 A1* 7/2014 Blaner et al. ................ 711/146
2014/0201468 A1* 7/2014 Blaner et al. ................ 711/146
2014/0229685 A1* 8/2014 Blaner et al. ................ 711/146
2014/0379997 A1* 12/2014 Blaner et al. ................ 711/146

OTHER PUBLICATIONS

A. Nahir et al., "Optimizing test-generation to the execution platform," 17th Asia and South Pacific Design Automation Conference (ASP-DAC), 2012, pp. 304-309.

K-D. Schubert et al., "Functional verification of the IBM POWER7 microprocessor and POWER7 multiprocessor systems," IBM Journal of Research and Development, vol. 55, No. 3, 2011, Paper 10, 17 pages.

Appendix P—List of IBM Patents or Patent Applications Treated as Related—May 9, 2015.

* cited by examiner

IMPLEMENTING SYSTEM IRRITATOR ACCELERATOR FPGA UNIT (AFU) RESIDING BEHIND A COHERENT ATTACHED PROCESSORS INTERFACE (CAPI) UNIT

This application is a continuation application of Ser. No. 14/585,602 filed Dec. 30, 2014.

FIELD OF THE INVENTION

The present invention relates generally to the data processing field, and more particularly, relates to method and apparatus for implementing a system irritator accelerator field programmable gate array (FPGA) Unit (AFU) residing behind a Coherent Attached Processors Interface (CAPI) unit in a computer system.

DESCRIPTION OF THE RELATED ART

As hardware designs get larger and more complex the more difficult it becomes to verify these designs. Part of the issue is designs become so large that traditional software based hardware simulators take far too long to provide enough test cases before the design needs to be released. To help remedy this situation some designs use the first round of hardware to help flush out any remaining issues. However since the designs are so new and there are limited resources then the number of possible workload scenarios can be limited. This can make the task of providing all the needed cases hard to do before the production release of hardware occurs.

A need exists for an efficient and effective method and apparatus for implementing a system irritator accelerator field programmable gate array (FPGA) Unit (AFU) residing behind a Coherent Attached Processors Interface (CAPI) unit in a computer system.

SUMMARY OF THE INVENTION

Principal aspects of the present invention are to provide a method and apparatus for implementing system irritator accelerator field programmable gate array (FPGA) Units (AFUs) residing behind a Coherent Attached Processors Interface (CAPI) unit in a computer system. Other important aspects of the present invention are to provide such method and apparatus substantially without negative effects and that overcome many of the disadvantages of prior art arrangements.

In brief, a method and apparatus are provided for implementing system irritator accelerator field programmable gate array (FPGA) Units (AFUs) residing behind a Coherent Attached Processors Interface (CAPI) unit in a computer system. An AFU is implemented in an FPGA residing behind the CAPI unit, the AFU includes a system irritator accelerator. A processor configures the AFU and enables the AFU system irritator to execute. The AFU system irritator is replicated to create additional irritation and is re-programmable.

In accordance with features of the invention, the re-programmable hardware based AFU system irritator drives asynchronous traffic in order to verify an electronic design, such as a processor system on a chip (SoC) design. It is advantageous to verify complex designs, such as SoC designs using asynchronous irritation. Asynchronous irritation causes multiple timing windows to be identified and debugged. Asynchronous irritation is common in simulation environments. The present invention implements an AFU system irritator to enable enhanced asynchronous verification techniques in FPGA and lab environments. It should be understood that the term asynchronous irritation is not intended to mean asynchronous to a specific clock, but more to the processors and other devices which are directly attached to the system bus. Asynchronous irritation is meant to signify that the AFU is creating traffic independently of the other processors and devices that it is irritating the system/chip by being programmed to have traffic which either collides with traffic from other processors/devices (i.e. to system addresses which require arbitration and/or some kind of handshaking for all desired accesses to occur) or causes unique state-space of the hardware design under test to be exercised.

In accordance with features of the invention, the AFU system irritator includes a read memory irritator that performs biased memory reads to memory locations in various cache line states, a write memory irritator that performs biased memory writes to memory locations in various cache line states; a cache injection irritator that performs cache injections; an interrupt irritator that causes interrupts, both main line through AFU command interface and AFU error scenarios; and a scratch pad memory irritator that causes read and write traffic collisions to the AFU scratch pad memory.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and apparatus are provided for implementing system irritator accelerator field programmable gate array (FPGA) Units (AFUs) residing behind a Coherent Attached Processors Interface (CAPI) unit in a computer system. The AFU is implemented in an FPGA residing behind the CAPI unit, the AFU includes a system irritator accelerator. A processor configures the AFU and enables the AFU system irritator to execute. The AFU system irritator is replicated to create additional irritation and is re-programmable.

Figure 1:
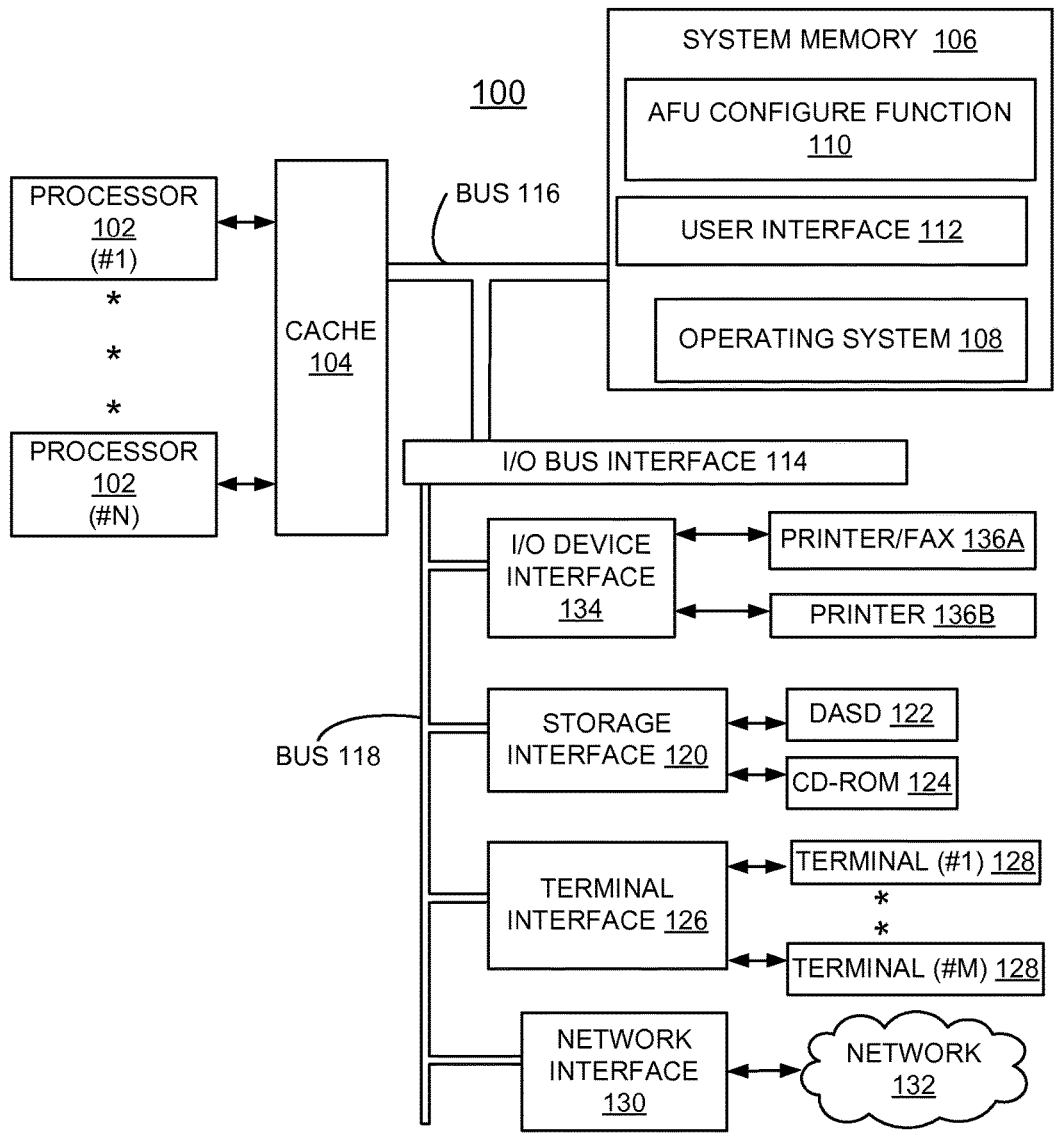
FIG. 1 is a block diagram of an example computer system for implementing a system irritator accelerator field programmable gate array (FPGA) Unit (AFU) residing behind a Coherent Attached Processors Interface (CAPI) unit in accordance with preferred embodiments.

Having reference now to the drawings, in FIG. 1, there is shown a computer system embodying the present invention generally designated by the reference character 100 for implementing a system irritator accelerator field programmable gate array (FPGA) Unit (AFU) residing behind a Coherent Attached Processors Interface (CAPI) unit in accordance with the preferred embodiment. Computer system 100 includes one or more processors 102 or general-purpose programmable central processing units (CPUs) 102, #1-N. As shown, computer system 100 includes multiple processors 102 typical of a relatively large system; however, system 100 can include a single CPU 102. Computer system 100 includes a cache memory 104 connected to each processor 102.

Computer system 100 includes a system memory 106. System memory 106 is a random-access semiconductor memory for storing data, including programs. System memory 106 is comprised of, for example, a dynamic random access memory (DRAM), a synchronous direct random access memory (SDRAM), a current double data rate (DDRx) SDRAM, non-volatile memory, optical storage, and other storage devices.

System memory 106 stores an operating system 108, an AFU configure function 110 in accordance with the preferred embodiments, and a user interface 112.

I/O bus interface 114, and buses 116, 118 provide communication paths among the various system components. Bus 116 is a processor/memory bus, often referred to as front-side bus, providing a data communication path for transferring data among CPUs 102 and caches 104, system memory 106 and I/O bus interface unit 114. I/O bus interface 114 is further coupled to system I/O bus 118 for transferring data to and from various I/O units.

As shown, computer system 100 includes a storage interface 120 coupled to storage devices, such as, a direct access storage device (DASD) 122, and a CD-ROM 124. Computer system 100 includes a terminal interface 126 coupled to a plurality of terminals 128, #1-M, a network interface 130 coupled to a network 132, such as the Internet, local area or other networks, shown connected to another separate computer system 133, and a I/O device interface 134 coupled to I/O devices, such as a first printer/fax 136A, and a second printer 136B.

I/O bus interface 114 communicates with multiple I/O interface units 120, 126, 130, 134, which are also known as I/O processors (IOPs) or I/O adapters (IOAs), through system I/O bus 116. System I/O bus 116 is, for example, an industry standard PCI bus, or other appropriate bus technology.

In accordance with features of the invention, testing and verifying a complex design, such as a processor system on a chip (SoC), is implemented using a system irritator Accelerator FPGA Unit (AFU) residing behind a Coherent Attached Processors Interface (CAPI) unit.

In accordance with features of the invention, a re-programmable hardware based AFU system irritator drives asynchronous traffic in order to verify an electronic design, such as a processor system on a chip (SoC) design.

Figure 2:
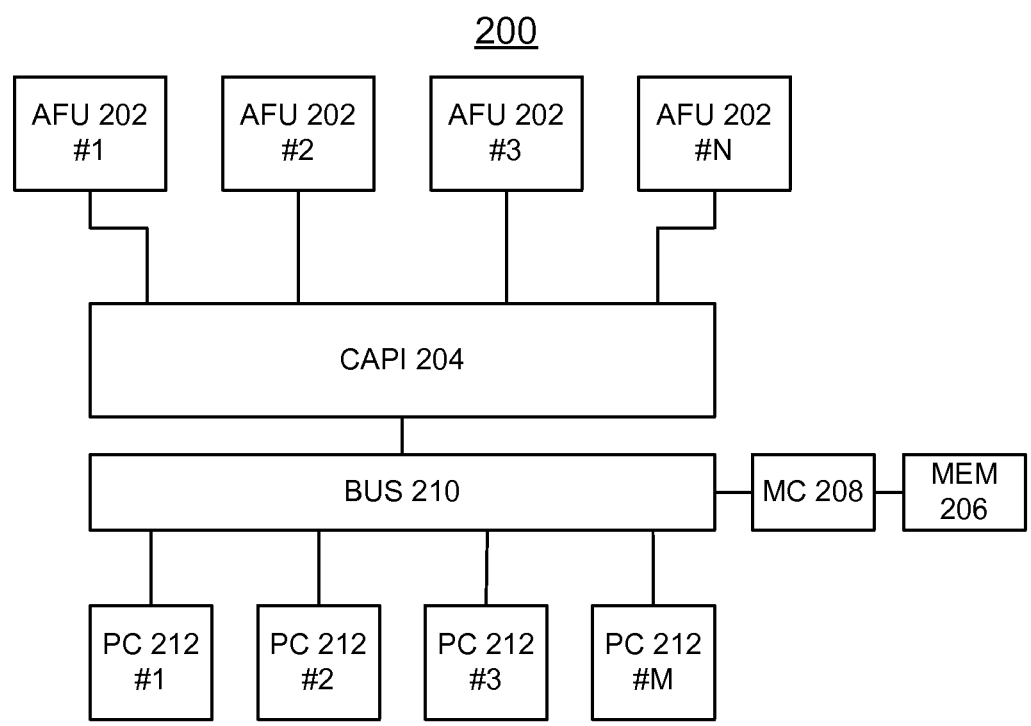
FIG. 2 is a block diagram of example apparatus including a Coherent Attached Processors Interface (CAPI) unit and irritator accelerator field programmable gate array (FPGA) Units (AFUs) in accordance with preferred embodiments.

Referring now to FIG. 2, there is shown an example apparatus generally designated by the reference character 200 including a plurality of irritator accelerator field programmable gate array (FPGA) Units (AFUs) 202, #1-N together with a Coherent Attached Processors Interface (CAPI) unit 204 in accordance with a preferred embodiment. As shown, apparatus 200 includes a system memory 206 coupled by a memory controller 208 to a bus 210, the CAPI unit 204, and a plurality of processors 212, #1-M. The AFUs 202 is coherently attached via the CAPI 204 is attached to the system bus 210 to which various other processors and devices can be attached.

It should be understood that optionally there are multiple chips with various processors, memories, and CAPIs 204 together with AFUs 202 connected via links such that the system memory and other components are scattered among multiple chips. In general apparatus 200 may be implemented to test with one chip design, but could be connected to a larger system.

Figure 3:
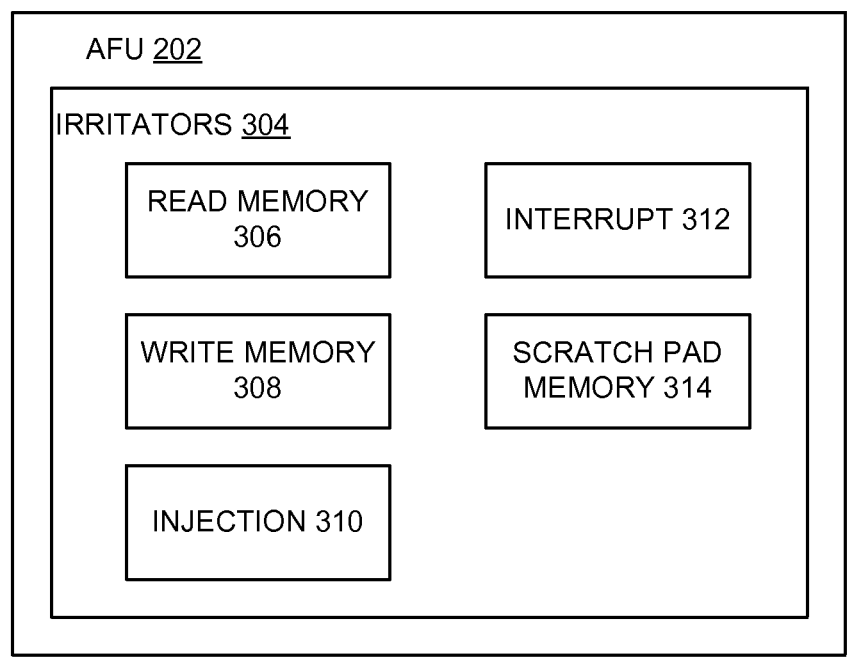
FIG. 3 is a block diagram of example apparatus of the AFUs of FIG. 2 for implementing enhanced irritators in read memory, write memory, injection, interrupt and scratch pad memory in accordance with a preferred embodiment.
Figure 4:
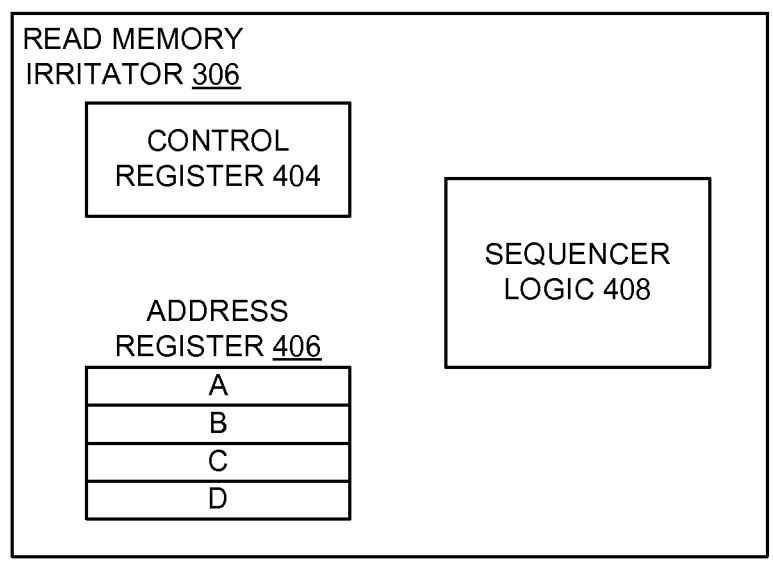
FIG. 4 is a block diagram example apparatus of the AFUs read memory irritator of the AFUs of FIGS. 2 and 3 in accordance with a preferred embodiment.

The AFUs 202 implements a system irritator accelerator, such as illustrated and described with respect to FIGS. 3 and 4. For example, a processor, such as processor 212 in FIG. 2 or processor 102 in FIG. 1, configures the AFU and enables the AFU system irritator to execute. It should be understood that the processor 212 that configures the AFU 202 could be from program code, such as software or operating system, user program and the like, and not hardware controlled. The AFU system irritator is replicated to create additional irritation and is re-programmable.

Referring now to FIG. 3, there is shown a block diagram of an example apparatus generally designated by the reference character 300 of the AFUs 202 of FIG. 2 for implementing enhanced irritators in read memory, write memory, injection, interrupt and scratch pad memory in accordance with preferred embodiments. The AFUs 202 includes a plurality of AFU irritators 304. AFU system irritator 202 includes a read memory irritator 306 that performs biased memory reads to memory locations in various cache line states, a write memory irritator 308 that performs biased memory writes to memory locations in various cache line states; a cache injection irritator 310 that performs cache injections; an interrupt irritator 312 that causes interrupts, both main line through AFU command interface and AFU error scenarios; and a scratch pad memory irritator 314 that causes read and write traffic collisions to the AFU scratch pad memory. All of the irritators 304 works concurrently with many existing lab exerciser software and work concurrently with existing production level operating systems in a biased configuration. Each of the irritators 306, 308, 310, 312, and 314 have bias controls implemented in order to control the type and operation of irritation.

Referring now to FIG. 4, there is shown a block diagram of an example apparatus generally designated by the reference character 400 of the AFUs read memory irritator 306 of the AFUs 202 of FIGS. 2 and 3 in accordance with a preferred embodiment. Read memory irritator 306 includes a control register 404, address register 406, and sequencer logic 408.

Figure 5:
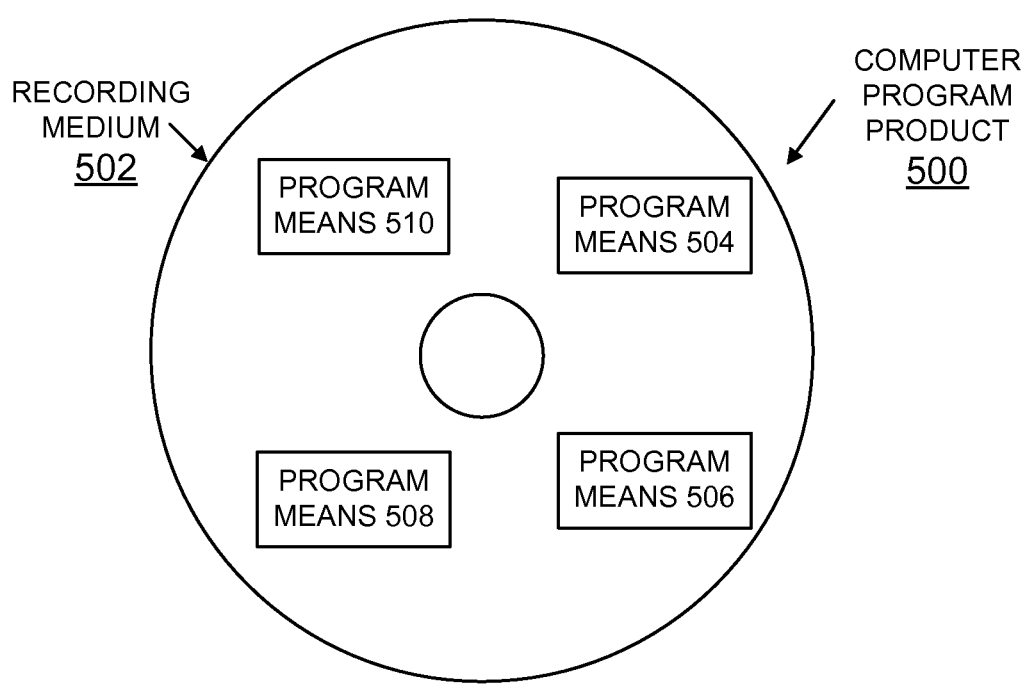
FIG. 5 is a block diagram illustrating a computer program product in accordance with the preferred embodiment.

Referring now to FIG. 5, an article of manufacture or a computer program product 500 of the invention is illustrated. The computer program product 500 is tangibly embodied on a non-transitory computer readable storage medium that includes a recording medium 502, such as, a floppy disk, a high capacity read only memory in the form of an optically read compact disk or CD-ROM, a tape, or another similar computer program product. Recording medium 502 stores program means 504, 506, 508, and 510 on the medium 502 for carrying out the methods for implementing testing and verifying a complex design, such as a processor SoC is implemented using a system irritator Accelerator FPGA Unit (AFU) 202 residing behind a Coherent Attached Processors Interface (CAPI) unit 204 of the preferred embodiment in the systems 100, 200, of FIGS. 1, 2, 3, and 4.

A sequence of program instructions or a logical assembly of one or more interrelated modules defined by the recorded program means 504, 506, 508, and 510, direct the systems 100, 200, for implementing system irritator accelerator FPGA Unit (AFU) 202 of the preferred embodiment.

While the present invention has been described with reference to the details of the embodiments of the invention shown in the drawing, these details are not intended to limit the scope of the invention as claimed in the appended claims.

What is claimed is:

1. A method for implementing system irritator accelerator field programmable gate array (FPGA) Units (AFUs) residing behind a Coherent Attached Processors Interface (CAPI) unit in a computer system comprising:
    providing a system processor;
    providing an accelerator function unit (AFU) implemented in a field programmable gate array (FPGA) residing behind a Coherent Attached Processors Interface (CAPI) unit; providing a plurality of AFU irritators including a read memory irritator, a write memory irritator, a cache injection irritator, an interrupt irritator, and scratch pad memory irritator implementing an AFU system irritator in said AFU;
    said system processor performing the steps of:
    configuring the AFU and enabling said AFU system irritator to execute irritation testing and verifying a design;
    replicating said AFU system irritator to create additional irritation testing and said AFU system irritator being re-programmable.

2. The method as recited in claim 1, includes said system processor reprogramming said AFU system irritator to execute additional irritation testing.

3. The method as recited in claim 1, wherein said AFU system irritator drives asynchronous traffic to verify a system on a chip (SoC) design.

4. The method as recited in claim 1, wherein said AFU system irritator performs biased memory reads to memory locations in various cache line states using said read memory irritator.

5. The method as recited in claim 1, wherein said AFU system irritator performs biased memory writes to memory locations in various cache line states using said write memory irritator.

6. The method as recited in claim 1, wherein said AFU system irritator performs cache injections using said cache injection irritator.

7. The method as recited in claim 1, wherein said AFU system irritator performs interrupts including main line interrupts through an AFU command interface and AFU error scenario interrupts using said interrupt irritator.

8. The method as recited in claim 1, wherein said AFU system irritator using said scratch pad memory irritator performs read and write traffic collisions to the AFU scratch pad memory.

9. The method as recited in claim 1, wherein said AFU system irritator using said bias controls bias settings for addresses, sequencer logic and setting a control register.

* * * * *